(12) United States Patent
Akai

(10) Patent No.: US 6,650,464 B2
(45) Date of Patent: Nov. 18, 2003

(54) LASER PROCESSING DEVICE AND ORGANIC ELECTROLUMINESCENT DISPLAY PANEL USING THE SAME

(75) Inventor: Tomonori Akai, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 85 days.

(21) Appl. No.: 10/054,693

(22) Filed: Jan. 24, 2002

(65) Prior Publication Data
US 2002/0098614 A1 Jul. 25, 2002

(30) Foreign Application Priority Data
Jan. 25, 2001 (JP) .......................... 2001-017201

(51) Int. Cl.[7] .................... G02F 1/29; H05B 31/26; C23C 14/00
(52) U.S. Cl. .................. 359/299; 315/111.21; 118/50.1
(58) Field of Search ............... 359/245, 288, 359/299; 315/111.21; 156/345; 219/121.86; 427/596; 118/50.1

(56) References Cited

U.S. PATENT DOCUMENTS 5,281,575 A * 1/1994 Hase et al. ................. 505/474
6,424,093 B1 * 7/2002 Mir et al. ................. 315/169.3
2001/0036561 A1 * 11/2001 Wolk et al. ................. 428/690

FOREIGN PATENT DOCUMENTS

| JP | 9-167684 | 6/1997 |
| JP | 10-208881 | 8/1998 |
| JP | 11-260549 | 9/1999 |

* cited by examiner

Primary Examiner—Georgia Epps
Assistant Examiner—William Choi
(74) Attorney, Agent, or Firm—Nixon & Vanderhye, P.C.

(57) ABSTRACT

A laser processing device comprising: an optical system having a laser beam source, and an air-tight chamber provided separately from the optical system, wherein the chamber has a transparent portion for transmitting a laser beam emitted from the laser beam source, on a light-receptive face thereof receiving the laser beam, the chamber is capable of accommodating a donor substrate on which an organic substance layer including at least a luminous layer to be transferred is formed and an acceptor substrate onto which the organic substance layer is transferred from the donor substrate by the laser beam transmitted through the transparent portion, and the inside of the air-tight chamber is in an inert gas atmosphere or in a vacuum atmosphere.

6 Claims, 6 Drawing Sheets

FIG. 1

|  | Embodiment 1 | Embodiment 2 | Comparative Example |
|---|---|---|---|
| Environment upon Transfer | In inert gas (in nitrogen gas) | In vacuum | In atmosphere |
| Luminescing state | Satisfactory | Satisfactory | Dark spots (Many dark spots observed) |

LASER PROCESSING DEVICE AND ORGANIC ELECTROLUMINESCENT DISPLAY PANEL USING THE SAME

CROSS-REFERENCES TO RELATED APPLICATIONS

This application is related to Japanese applications No. 2001-017201 filed on Jan. 25, 2001 whose priority is claimed under 35 USC § 119, the disclosures of which are incorporated by reference in their entirety.

BACKGROUND OF THE INVENTION

1. Field of the Invention

The present invention relates to a laser processing device, and more particularly to a laser processing device in case where a transfer method is used as a method for forming an organic substance layer in an organic electroluminescent display panel using an organic electroluminescent element at its pixel luminescing portion having an element structure of a substrate; a first electrode; an organic substance layer including at least a luminous layer; and a second electrode.

The present invention also relates to an organic electroluminescent display panel using the laser processing device.

2. Description of the Prior Arts

A demand has rapidly been increasing to a display panel as a man-to-machine interface as the times of multi-media has come around. A liquid crystal display panel has widely been used, among various display panels, because of the characteristics of thin-size, reduced consumptive electric power, or the like.

Pixel portions of R (red), G (green) and B (blue) are required to be formed for establishing a full-color display on the liquid crystal display. The liquid crystal display achieves this object by using a color filter transmitting each color of R, G and B. A well-known popular photolithography method has generally been applied for minutely patterning these color filters into R, G and B.

However, the patterning has been difficult nowadays due to a progressed high precision of the display. Further, the influence given to the environment is concerned, since developing solution such as organic solvent is used in a great amount upon developing.

In recent years, a transfer method has been paid an attention as a pattern forming method of a color filter made of an organic substance.

When the transfer method is applied for a method for forming the color filter of the liquid crystal display device, a thin-film layer that is to be transferred is firstly formed onto a donor substrate comprised of a PET (polyethylene terephthalate) film or the like by a vapor-deposition method, spin coating method or printing method. The resultant thin-film layer is then adhered to an acceptor substrate on which the film is expected to be formed. A laser beam from a laser beam source is applied from the donor substrate to thereby transfer the thin-film layer formed at the side of the donor substrate to the acceptor substrate side. Thereafter, the donor substrate is detached, whereby the portion to which the laser beam is irradiated is transferred to the acceptor substrate.

The structure of the donor substrate used for the transfer method is not specifically limited. When laser beam is utilized for an energy source, the use of a film having a thermal transmission layer, light-to-heat conversion layer or separate layer formed thereon enhances a transfer efficiency.

The excellent points of the transfer method are that the patterning is not specifically required for forming the thin-film onto the donor substrate and that the portion irradiated by laser beam is only transferred onto the acceptor substrate from the donor substrate. Further, a small adverse affect to the environment can be taken as one of the excellent points of the transfer method.

Frequently, the donor substrate and the acceptor substrate are fixedly adhered with each other upon performing the transfer process. The film-formation principle lies in the fusing or sublimation of the area irradiated by laser beam or heat because of an instantaneous rise in the temperature of this area. This is an instantaneous phenomenon. Therefore, the organic substance thin-film remains intact, whereby the film formed on the donor substrate is exactly formed onto the acceptor substrate side.

FIG. 5 is a schematic view showing a process for forming an organic substance thin-film such as a color filter on a acceptor substrate with the transfer method.

A donor substrate (101) has an organic substance thin-film layer (102) formed by a known method such as the spin coating method or vapor-deposition method. The donor substrate (101) may be a single PET film, but in many cases, it has a light-to-heat conversion layer, thermal transmitting layer or separate layer suitably formed thereon for performing a satisfactory transfer.

The donor substrate (101) adheres to an acceptor substrate (103) on which, for example, a transparent electrode line is wired such that the side of the donor substrate (101) having the organic substance thin-film layer (102) formed thereon contacts with the acceptor substrate (103). A roller method or vacuum laminate method is frequently used for adhering the donor substrate to the acceptor substrate.

Subsequently, laser beam (105) is irradiated from the side of the donor substrate (101) by a laser beam source (heat source) (104). The excessive large distance between the heat source (104) and the donor substrate (101) reduces a laser intensity, thus inconvenient. On the other hand, satisfactory transferring conditions can be set by suitably mounting a lens (106) or slit plate (107) between the heat source (104) and the donor substrate (101).

On the other hand, an organic electroluminescent display panel using an organic electroluminescent element at its pixel luminescing portion has been developing as a display panel in the future generation that takes place of the liquid crystal display panel.

The organic electroluminescent display panel using an organic electroluminescent element at its pixel luminescing portion has an element structure of a substrate; a first electrode; an organic substance layer including at least a luminous layer; and a second electrode. It has features of a thin-size, completely solid-state, plane self-luminescence and high-speed response.

FIG. 6 is a structural sectional view of an organic electroluminescent element having a general structure wherein luminescence is taken out from the first electrode side.

A transparent first electrode (202) is formed on a transparent substrate (201). An organic substance layer (203) including at least a luminous layer and a second electrode (204) made of a metal thin film are successively formed on the first electrode (202).

Luminescence (205) is obtained via the transparent substrate (201) and the transparent first electrode (202). ITO (indium tin oxide) is used as the first electrode (202) in most cases. The ITO is widely utilized in a liquid crystal display panel. The formation of the wiring is easy by using the ITO, whereby its technique can also be applied to the organic electroluminescent element.

The principle of the luminescence in the organic electroluminescent element is based upon the fact that the application of voltage between the electrodes injects an electron from one electrode to the luminous layer while injects a hole from the other electrode to the same layer, which brings a plane luminescence from the luminous layer because of the re-combination of these electron and hole.

Therefore, either one of the electrodes is desirably transparent in order to obtain the plane luminescence. In most cases, a transparent conductive film is used as the first electrode formed on the substrate for taking out the luminescence. In this case, the substrate has to be transparent for taking out the luminescence. Specifically, the element structure becomes as follows: a transparent substrate; a transparent first electrode; an organic substance layer including at least a luminous layer; and a second electrode that does not have to be transparent.

Subsequently, a manufacturing process of the organic electroluminescent element will be explained. The first electrode formed on the substrate is made generally of the ITO as described above. Specifically, the first electrode is formed by forming the ITO on the whole surface of the substrate by a sputtering method, followed by performing a patterning by a known photolithography to a predetermined shape. The processing precision of the ITO is high even though the process requires a high-precise technique, thus no problem.

Further, a metal thin film is used as the second electrode formed on the organic substance layer. The second electrode is formed by an electron beam method, sputtering method or vapor-deposition method.

As for the formation of the organic substance layer including at least the luminous layer, the organic substance layer is generally formed by the vapor-deposition method in case where the layer is made of a low-molecular material, while it is generally formed by the spin coating method in case where the layer is made of a high-molecular material.

However, the luminous layer is required to have different colors each corresponding to R, G and B upon manufacturing a display panel using the organic electroluminescent element at its pixel luminescing portion. This can be done by using a shadow mask method, ink jet printing method or the like. However, it is extremely difficult to execute the process with high precision by these methods.

In order to solve the problem concerning the high-precision, a transfer method used for forming a color filter of the liquid crystal display panel has been proposed to be applied to a method for forming a thin-film layer of the organic electroluminescent element as a new film-forming method for the organic electroluminescent element.

Forming the organic substance layer including at least the luminous layer in the organic electroluminescent element by the transfer method is disclosed in, for example, Japanese Unexamined Patent Application Nos. HEI9-167684, HEI10-208881 and HEI11-260549. Specifically, the disclosed method is as follows: Firstly, the organic substance thin-film layer to be transferred is formed on a donor substrate made of a PET (polyethylene terephthalate) film by the vapor-deposition method, spin coating method or sputtering method. The resultant is adhered to an acceptor substrate on which the film is expected to be formed. Thereafter, energy such as laser beam or heat is applied to the resultant from the donor substrate side to, thereby transfer the organic substance thin-film layer formed on the donor substrate onto the acceptor substrate. The organic substance used for the organic electroluminescent element may be a low-molecular or high-molecular material.

Various methods such as the vapor-deposition method, ink jet method, spin coating method, printing method or the like have been applied so far for forming the organic substance layer.

The advantage of the transfer method is that the high-precision which is difficult to be obtained in the shadow mask method or ink jet method can easily be achieved. This is because the laminated thin-film formed on the donor substrate is formed such that only the portions of the thin-film irradiated by the laser beam or heat source upon the transfer are exactly transferred in the reverse order on the acceptor substrate. Another advantage is that the patterning is not specifically required upon forming the organic substance layer on the donor substrate.

Next, the method for forming each layer will be explained. The first electrode is formed by using the ITO with a known photolithography. As for the organic substance layer, it is generally formed by the vapor-deposition method if made of a low-molecular material while it is formed by the spin coating method if made of a high-molecular material. The luminous layer is required to have different colored portions upon manufacturing the display panel having the organic electroluminescent element used in the pixel luminescing portion. This can be achieved by using donor substrates each having a differently colored luminous layer for performing the successive transfer. A metal thin-film is used for the second electrode formed on the organic substance layer. The second electrode is formed by the electron beam method, sputtering method or vapor-deposition method.

The organic substance layer used for the pixel luminescing layer in the organic electroluminescent display panel has been known as having a remarkably low resistance. When left in the atmosphere, in particular, it is damaged by water content or oxygen content, entailing a problem that it is difficult to manufacture a good-looking display panel.

In most cases, a sealing process is performed under the present conditions so as not to expose the first electrode, the organic substance layer including at least the luminous layer and the second electrode to the atmosphere. To be absolutely sure, absorption agent or oxygen absorbent is sometimes sealed.

This is greatly different from the color filter of the liquid crystal display panel. Specifically, the color filter of the liquid crystal display panel has little limitation on its thickness that is several microns in most cases. Therefore, strict limitation is not established on the distribution and unevenness of the thickness.

Further, transmitting a specific wavelength in backlight or reflected light is good enough for the color filter. Therefore, the color filter may be formed in most cases by using a color film in which pigment or the like is dispersed. Accordingly, it has sufficient resistance in the atmosphere, so that the environmental conditions upon the transfer are not specifically considered. As shown in FIG. 5, the transfer can be executed in the atmosphere.

When the organic substance layer used for the pixel luminescing portion of the organic electroluminescent display panel is formed by the transfer method, the damage is severe when the organic substance layer is exposed in the atmosphere, since it has a thickness of 2000 angstroms at most that is remarkably thinner than the color filter.

Different from the color filter of the liquid crystal display panel that transmits light, the organic substance layer used for the pixel luminescing portion of the organic electroluminescent display panel is charged with electricity. Therefore, the organic substance layer is very delicate to the distribution and unevenness of the thickness. The organic substance layer has a structure such that a plurality of organic thin films are laminated for enhancing its performance. Therefore, the execution of the transfer process in the atmosphere entails a problem of causing a separation at the boundary of each thin film.

Considering the above-mentioned points, the transfer process should be performed under the environmental condition with the influence from water content or oxygen content eliminated compared to the formation of the color filter in the liquid crystal display panel, in case where the organic substance layer used for the pixel luminescing portion of the organic electroluminescent display panel is formed by the transfer method.

However, sufficient research has not been made so far for forming by the transfer method the organic substance layer used for the pixel luminescing portion of the organic electroluminescent display panel. It has not been considered that the organic substance layer including at least the luminous layer should be protected from the surrounding environmental condition.

The present invention is accomplished in view of these circumstances, and aims to provide a laser processing device and an organic electroluminescent display panel using the same, which is capable of protecting an organic substance layer including at least a luminous layer from the surrounding environmental condition, when the organic substance layer used for a pixel luminescing portion of the organic electroluminescent display panel is formed by a transfer method.

SUMMARY OF THE INVENTION

According to one aspect of the present invention, the invention provides a laser processing device comprising: an optical system having a laser beam source, and an air-tight chamber provided separately from the optical system, wherein the chamber has a transparent portion for transmitting a laser beam emitted from the laser beam source, on a light-receptive face thereof receiving the laser beam, the chamber is capable of accommodating a donor substrate on which an organic substance layer to be transferred is formed and an acceptor substrate onto which the organic substance layer is transferred from the donor substrate by the laser beam transmitted through the transparent portion, and the inside of the air-tight chamber is in an inert gas atmosphere or in a vacuum atmosphere.

According to the laser processing device having the above-mentioned structure, the organic substance layer can be protected from the surrounding environmental condition upon forming the organic substance layer used for the pixel luminescing portion of the organic electroluminescent display panel. This is because the inside of the air-tight chamber is in the inert gas atmosphere or in the vacuum atmosphere.

According to another aspect of the present invention, it provides an organic electroluminescent display panel manufactured by using the laser processing device, this display panel having a following element structure of a substrate; a first electrode; an organic substance layer including at least a luminous layer; and a second electrode wherein said organic substance layer including at least the luminous layer is formed by a transfer method.

The organic electroluminescent display panel having the above-mentioned structure can yield satisfactory luminescence, in spite of having the same element structure as the conventional panel. This is because the organic substance layer including at least the luminous layer is protected from the surrounding environmental condition as described above upon its formation.

BRIEF DESCRIPTION OF THE DRAWINGS

The present invention will become more fully understood from the detailed description given hereinbelow and the accompanying drawings that are given by way of illustration only, and thus are not to be considered as limiting the present invention.

FIG. 1 is a table showing the results of each illuminating state of an organic electroluminescent display panel manufactured in the embodiments 1 and 2 according to the present invention and comparative example;

DESCRIPTION OF THE PREFERRED EMBODIMENT

Figure 2:
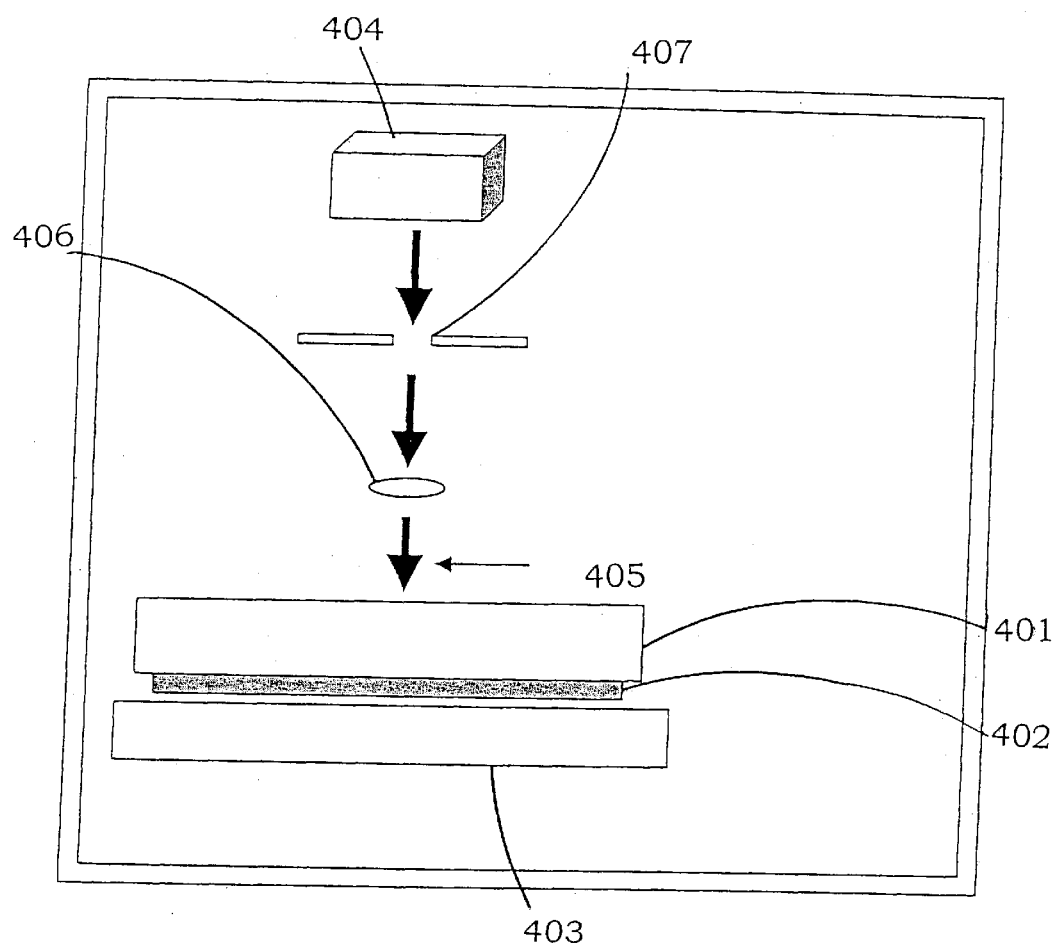
FIG. 2 is a schematic view showing one of devices according to the embodiment of the invention for forming on a substrate an organic substance layer that becomes a pixel luminescing portion of an organic electroluminescent display panel by a transfer method, and more particularly a schematic view showing a state in which a laser processing device is entirely covered by a glove box.

The optical system in the laser processing device of the present invention includes a slit plate, a light-collective lens and/or the like provided as appropriate in addition to the laser beam source. A laser beam generating device is, for example, used for the laser beam source.

The air-tight chamber is provided separately from the optical system, for accommodating the donor substrate and the acceptor substrate. The transparent portion of the chamber is provided between the laser beam source and the donor substrate. The transparent portion transmits the laser beam (microwave) emitted from the laser beam source for conveying the microwave to the donor substrate, thereby executing the transfer.

Materials used for the donor substrate on which the organic substance layer to be transferred is formed are not specifically limited. A PET film is, for example, used for it.

Materials used for the acceptor substrate onto which the organic substance layer is transferred from the donor substrate are not specifically limited. A transparent glass plate is, for example, used for it.

Known means may be used for rendering the inside of the air-tight chamber in the inert gas atmosphere or in the vacuum atmosphere. For example, an inert gas cylinder or a vacuum pump is connected to the chamber via a connection pipe, a flow rate control valve and/or the like, and the pump or the valve is properly operated.

The reason why the inside of the air-tight chamber is in the inert gas atmosphere or in the vacuum atmosphere is to prevent the damage of the organic substance layer on the donor substrate. Types of the inert gas are not specifically limited. Nitrogen gas or argon gas is used.

The laser beam source in the laser processing device of the present invention is preferably a YAG laser or a YLF laser.

The laser processing device having the above-mentioned structure exhibits a stabilized laser output, thereby bringing a uniform thickness or uniform film performance of the transferred organic substance layer. Consequently, a satisfactory organic electroluminescent element can be obtained.

The laser processing device of the present invention preferably has a structure such that the laser beam source is a laser, and the transparent portion is provided with a transparent window, wherein the laser beam is irradiated from the outside of the chamber through the window to thereby transmit the laser beam to the donor substrate and the acceptor substrate under the state that the both substrates are isolated from the atmosphere.

The laser processing device having the above-mentioned structure can irradiate the laser beam from the outside of the chamber to the both substrates through the window under the state that the both substrates are isolated from an air atmosphere with the chamber rendered to have an inert gas atmosphere or a vacuum atmosphere. Therefore, the organic substance layer including at least the luminous layer can be protected from the surrounding environmental condition.

The transparent portion in the laser processing device according to the present invention is preferably the one having a transmittance of 90% or more of the wavelength of the laser beam from the laser beam source. It is confirmed by the experiment that, when the transmittance is below 90%, the laser beam from the laser beam source is not satisfactorily transmitted to the donor substrate.

The laser processing device having the above-mentioned structure can satisfactorily transmit the laser beam from the laser beam source to the donor substrate.

The transparent portion in the laser processing device of the present invention preferably has a shape of a convex lens having a focusing ability.

According to the laser processing device having this structure, the laser beam from the laser beam source is effectively transmitted to, thereby be capable of enhancing the transfer efficiency.

A preferred embodiment of the present invention will be explained in detail hereinbelow with reference to the drawings, by which the present invention is not limited.

Figure 3:
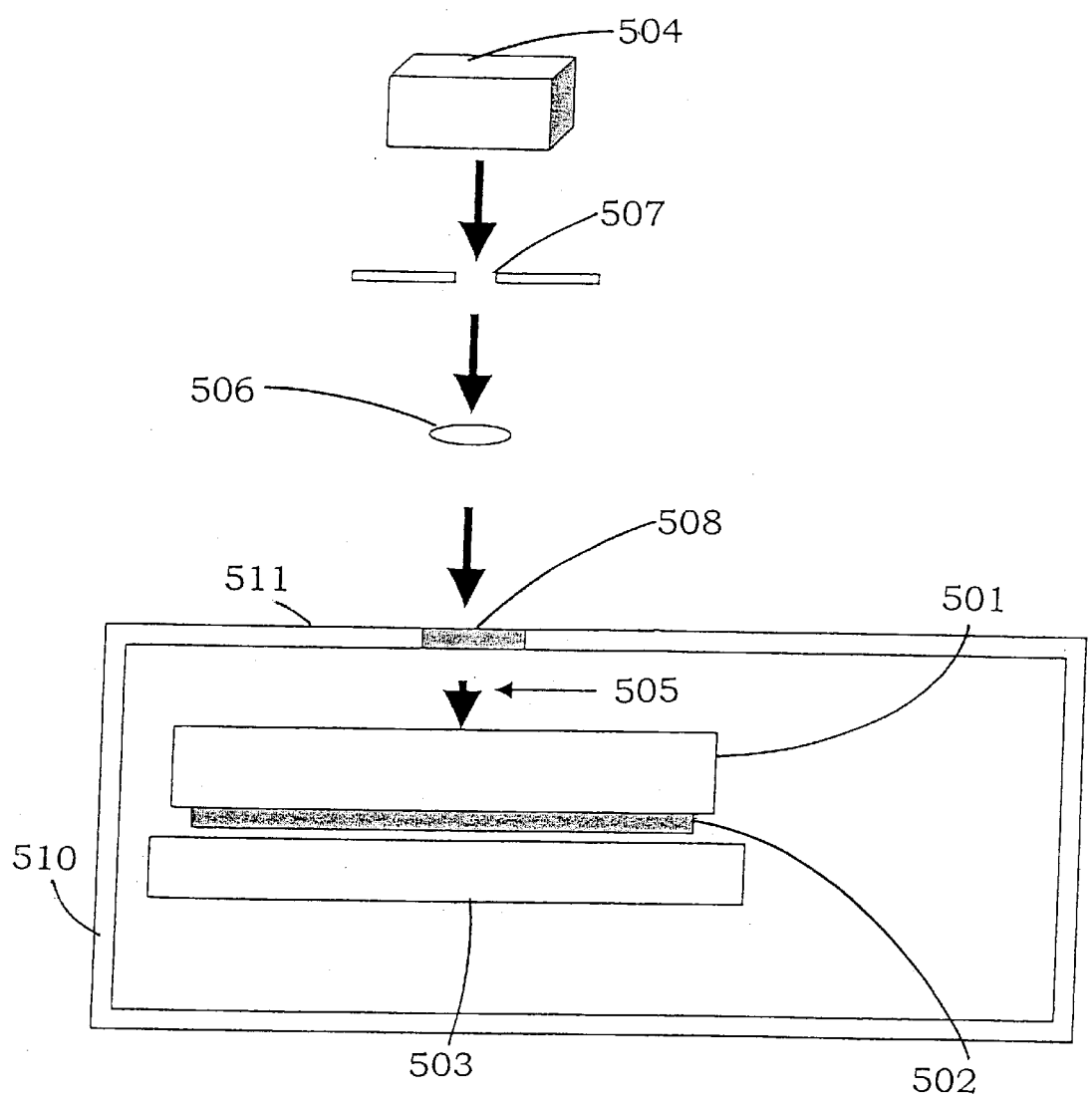
FIG. 3 is a schematic view showing another one of devices according to the embodiment of the invention for forming on an acceptor substrate an organic substance layer that becomes a pixel luminescing portion of an organic electroluminescent display panel by a transfer method, and more particularly a schematic view showing a state in which the acceptor substrate and a donor substrate are covered by a glove box.
Figure 4:
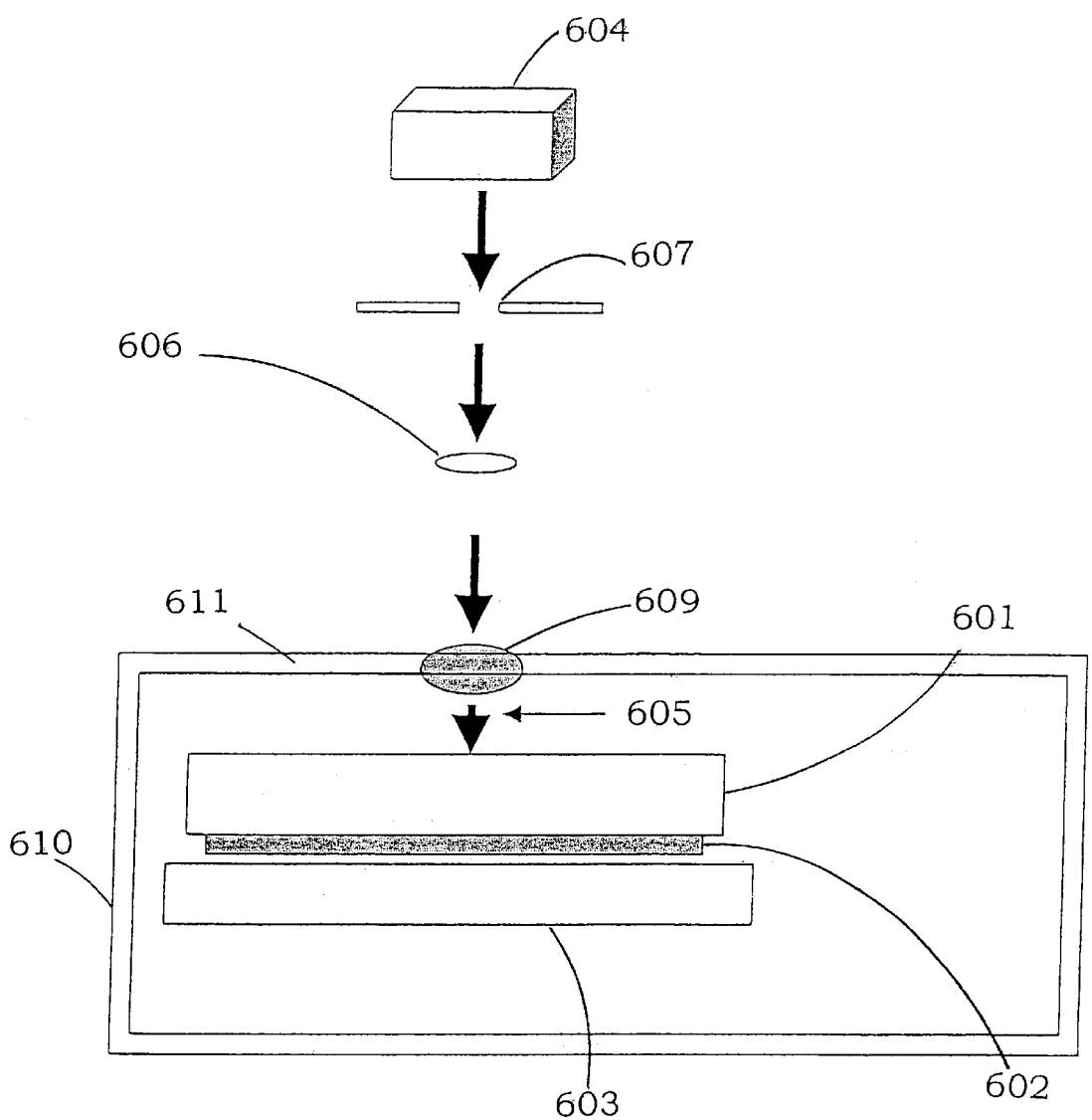
FIG. 4 is a schematic view showing another one of devices according to the embodiment of the invention for forming on an acceptor substrate an organic substance layer that becomes a pixel luminescing portion of an organic electroluminescent display panel by a transfer method, and more particularly a schematic view showing a state in which the acceptor substrate and a donor substrate are covered by a glove box.
Figure 5:
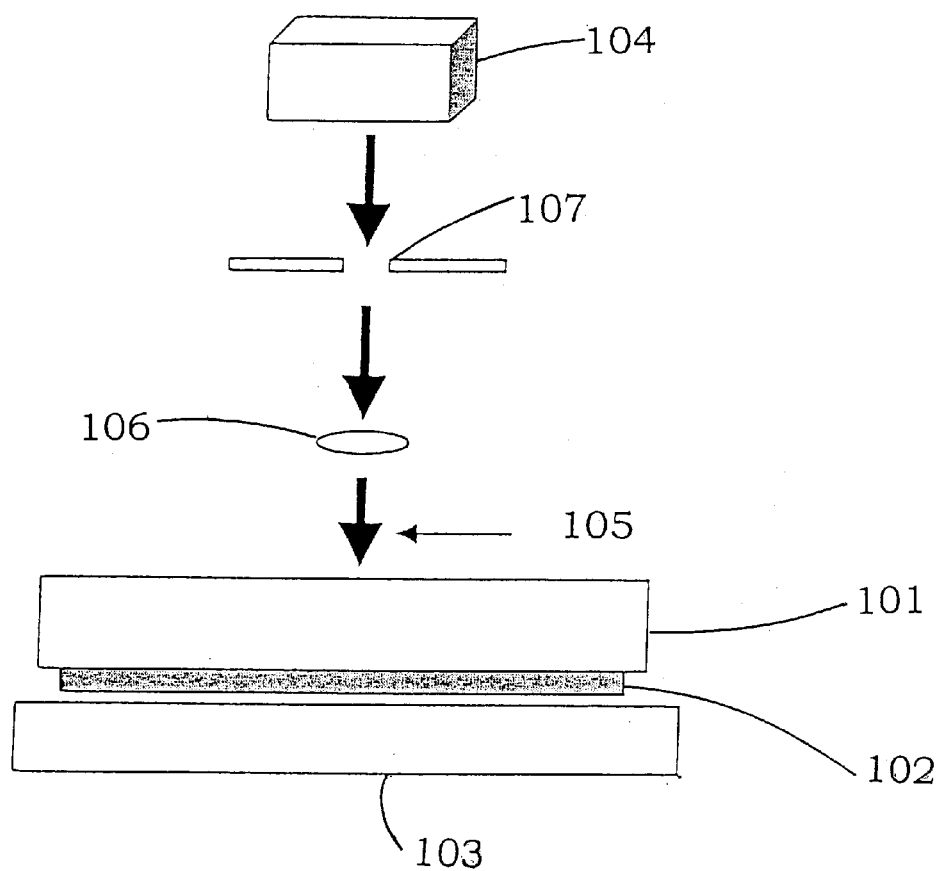
FIG. 5 is a schematic view showing a devices for forming an organic thin film of a color filter on an acceptor substrate for liquid crystal by a transfer method by using a conventional technique.
Figure 6:
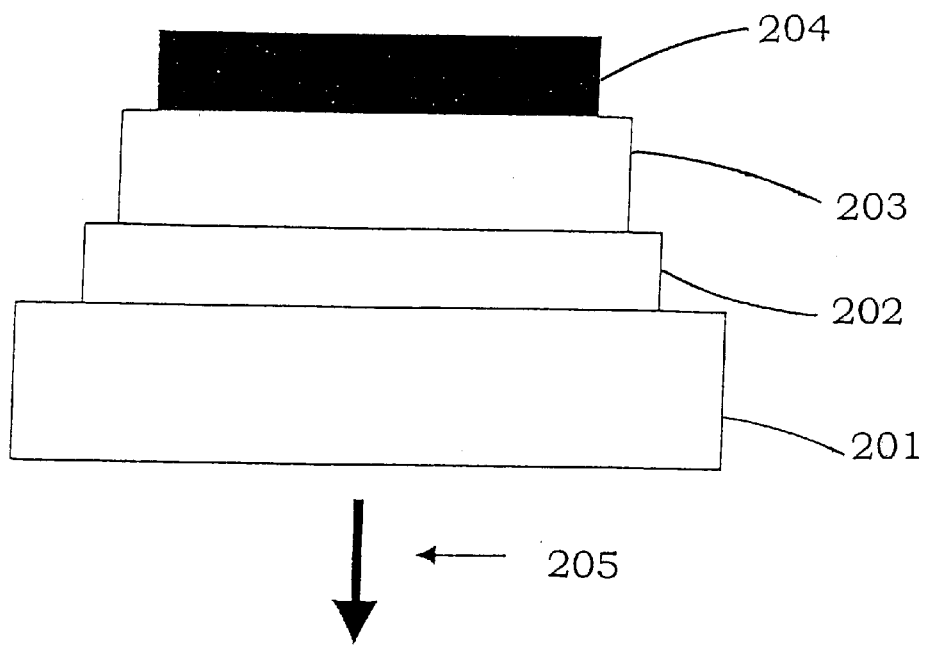
FIG. 6 is a sectional view of a general organic electroluminescent element in the conventional technique.

Laser processing devices shown in FIGS. 3 and 4 were used. Each of these laser processing devices comprise respectively an optical system having a laser beam source 504, 604, a slit plate 507, 607 and a light-collective lens 506, 606, and an air-tight chamber (a glove box) 510, 610 provided separately from the optical system.

The chamber 510, 610 has a transparent portion (a transparent window) 508, 609 for transmitting a laser beam emitted from the laser beam source 504, 604, on a light-receptive face thereof receiving the laser beam.

The chamber 510, 610 is capable of accommodating a donor substrate 501, 601 on which an organic substance layer 502, 602 to be transferred is formed and an acceptor substrate 503, 603 onto which the organic substance layer 502, 602 is transferred from the donor substrate 501, 601 by the laser beam 505, 605 transmitted through the transparent portion 508, 609.

The inside of the air-tight chamber 510, 610 is in an inert gas atmosphere or in a vacuum atmosphere.

Embodiment 1

(No. 1) Preparing a donor substrate 501, 601 to be transferred.

A film, particularly a PET film is frequently used for a base substrate as the donor substrate 501, 601 to be transferred. The PET film is convenient since it has an excellent heat resistance among various films and has a suitable flexibility. The thickness of the film is not specifically limited, but it is desirably about 50 microns to about 1 millimeter from the view point of the durability and facility in performing the transfer.

The donor substrate 501, 601 was provided with a light-to-heat conversion layer, heat transmission layer and separate layer for enhancing the transfer efficiency.

(No.2) Forming on the donor substrate 501, 601 an organic substance layer 502, 602 including at least a luminous layer.

The organic substance layer 502, 602 including at least the luminous layer is formed with a film-formation process on the donor substrate 501, 601 shown in (No. 1). Materials used for the organic substance layer 502, 602 are not specifically limited. Materials used for a general organic electroluminescent element can suitably be used. Usable film-forming methods include a vapor-deposition method, spin coating method, printing method, ink jet method, casting method or the like, all of which are well-known. These methods can suitably be selected to be used.

In most cases, a charge transporting layer and charge injecting layer are introduced, besides the luminous layer, into the organic substance layer 502, 602 of the organic electroluminescent element in order to enhance the performance of the element. Considering that these layers 502, 602 are transferred on an acceptor substrate 503, 603 at the later stage, these layers 502, 602 have to be laminated on the donor substrate 501, 601 in the reverse order. For example, when the organic electroluminescent element to be manufactured has an element structure in the order of a substrate; a first electrode; a hole injecting layer; a hole transporting layer; the luminous layer; an electron transporting layer; and a second electrode, the laminate structure formed on the donor substrate is in the order of the electron transporting layer; the luminous layer; the hole transporting layer; and the hole injecting layer.

(No. 3) Forming the first electrode on the acceptor substrate 503, 603.

Although the materials used for the acceptor substrate 503, 603 are not specifically limited, a transparent glass or plastic film is generally used. A transparent electrode material is used for the first electrode. Specific examples of such materials include ITO (indium tin oxide), tin oxide, IDIXO (a group of $In_2O_3$-ZnO material) or the like. Its thickness may suitably be set, but it is preferably about 500 angstroms to about 2000 angstroms in case that the ITO is used.

Known method can be applied for the film-formation method. Usable methods include an electron beam method, sputtering method, spray method or the like. If the first electrode is not required to be perfectly transparent, a metal thin-film such as gold or platinum may be used for it. These can be patterned into a predetermined shape by a known photolithography method or dry etching method. After the patterning, the surface of the first electrode is washed to thereby improve the luminous state of the organic electroluminescent element.

(No. 4) Placing the donor substrate 501, 601 and the acceptor substrate 503, 603 in inert gas.

The donor substrate 501, 601 and the acceptor substrate 503, 603 on which the first electrode is formed are set on a table for performing the transfer, followed by adhering with each other by a roller. Thereafter, they are arranged in each inert atmosphere glove box 510, 610 serving as a chamber. A portion of each glove box 510, 610 is rendered to be each transparent window 508, 609 serving as a transparent portion. Fully dried nitrogen gas having a dew point of minus 75° C. or below is used as the inert gas. Types of the inert gas are not specifically limited. Besides the nitrogen gas, argon gas can also be used. The donor substrate 501, 601 and the acceptor substrate 503, 603 are arranged in the inert gas, whereby the organic substance layer 502, 602 is not damaged by water content or oxygen content.

A laser beam source 404 may be arranged in the glove box as shown in FIG. 2. However, this deteriorates the workability of the laser beam source 404 and further requires a globe box having a large capacity.

In view of this, only the donor substrate 501 and the acceptor substrate 503 were set in the glove box 510, and provided at the upper portion 511 of the glove box 510 was a window 508 made of a transparent substrate that transmits laser beam (microwave) emitted from the laser beam source 504, as shown in FIG. 3. Materials used for this window are not specifically limited. When a YAG laser is used as the laser beam source 504, quartz or borosilicate glass can be used. It is to be noted that the materials used for the window desirably transmit 90% or more of the microwave. The microwave from the laser beam source 504 is not satisfactorily transmitted to the donor substrate 503 if the transmittance is under 90%.

Another example is shown in FIG. 4 wherein the shape of the transparent window 609 provided at the upper portion 611 of the glove box 610 is a convex lens structure. This structure effectively transmits the microwave to the donor substrate 601, thereby enhancing the transfer efficiency.

(No. 5) Adhering the donor substrate 501, 601 to the acceptor substrate 503, 603, and then, performing the transfer.

Subsequently, the microwave (laser beam) is irradiated from the laser processing device used for the transfer for executing the transfer. When a YAG laser is used for the laser beam source 504, 604 as the energy source for the transfer, the transferability is not so good with respect to the donor substrate 501, 601 having only the PET film, since the PET film is transparent. The suitable formation of the heat transmission layer or light-to-heat conversion layer on the film can enhance the transfer efficiency. The YAG laser has an oscillation wavelength of 1064 nm, so that it has an extremely excellent output stability such as within the range of several percents. Therefore, a high output can be obtained. Consequently, the use of the YAG laser yields a uniform thickness of the transferred organic substance layer 502, 602 upon actually performing the transfer, thereby obtaining a satisfactorily organic electroluminescent element.

The use of a YLF laser further heightens the expectation for improving the performance of the organic electroluminescent element. The reason is that the YLF laser is more excellent than the YAG laser in the stability of the laser oscillating output, beam position and beam angle of divergence, since the YLF laser has characteristics of extremely small thermal lens effect.

When the donor substrate 501, 601 is detached after the transfer, the organic substance layer 502, 602 including at least the luminous layer is transferred only onto the position of the acceptor substrate 503, 603 where the microwave is irradiated.

(No. 6) Forming the second electrode and performing a sealing process.

A second electrode is formed by a general resistance heating vapor-deposition method, electron beam vapor-deposition method, sputtering method or the like. The thickness of the second electrode is mostly determined in the range of about 500 angstroms to about 2000 angstroms, although it depends upon the types of the materials used for the second electrode.

The sealing process is executed after the formation of the second electrode. Then, terminals are connected to thereby complete the organic electroluminescent display panel in which the organic substance layer 502, 602 including at least the luminous layer is formed by the transfer method.

The embodiment 1 is composed of the above-mentioned processes of (No. 1) to (No. 6).

Embodiment 2

The embodiment 2 is almost the same as the embodiment 1 except for the following point. Specifically, in the transfer process wherein the donor substrate 501, 601 and the acceptor substrate 503, 603 are adhered to each other in the process (No. 4) at the embodiment 1, the donor substrate 501, 601 and the acceptor substrate 503, 603 were arranged in a glove box 510, 610 provided with a window 508, 609 made of a transparent substrate so as to transmit the microwave (laser beam) emitted from the laser beam source 504, 604, and then, the transfer was performed under vacuum condition.

The above-mentioned processes are rendered to be embodiment 2.

Comparative Example

The comparative example is basically the same as the embodiment 1 except for the following point. Specifically, the transfer process of No. 4 in the embodiment 1 in which the donor substrate and the acceptor substrate are adhered to each other was performed in the atmosphere like the case for forming a color filter of a liquid crystal display panel.

The above-mentioned processes are rendered to be the comparative example.

The table of FIG. 1 shows the results of the aforementioned embodiments 1 and 2 and comparative example. As understood from this table, a satisfactory luminescence could be obtained with respect to the organic electroluminescent display panels in the embodiments 1 and 2. However, non-luminescent area so-called dark spots were observed everywhere with respect to the organic electroluminescent display panel in the comparative example, thus presenting a remarkably bad appearance as the display panel. Further, the luminescence efficiency of the organic electroluminescent display panel in the comparative example was inferior to these of the organic electroluminescent display panels in the embodiments 1 and 2.

What is claimed is:

1. A laser processing device comprising:
   an optical system having a laser beam source, and
   an air-tight chamber provided separately from the optical system, wherein the chamber has a transparent portion for transmitting a laser beam emitted from the laser beam source, on a light-receptive face thereof receiving the laser beam, the chamber is capable of accommodating a donor substrate on which an organic substance layer including at least a luminous layer to be transferred is formed and an acceptor substrate onto which the organic substance layer is transferred from the donor substrate by the laser beam transmitted through the transparent portion, and the inside of the air-tight chamber is in an inert gas atmosphere or in a vacuum atmosphere.

2. A laser processing device claimed in claim 1, wherein said laser beam source is a YAG laser or a YLF laser.

3. A laser processing device claimed in claim 1, wherein said laser beam source is a laser, and said transparent portion is provided with a transparent window, wherein said laser beam is irradiated from the outside of said chamber through the window to, thereby transmit said laser beam to said donor substrate and said acceptor substrate under the state that the both substrates are isolated from the atmosphere.

4. A laser processing device claimed in claim 1, wherein said transparent portion is the one having a transmittance of 90% or more of the wavelength of said laser beam from said laser beam source.

5. A laser processing device claimed in claim 1, wherein said transparent portion has a shape of a convex lens having a focusing ability.

6. An organic electroluminescent display panel manufactured by using a laser processing device claimed in claim 1, this display panel having a following element structure of a substrate; a first electrode; an organic substance layer including at least a luminous layer; and a second electrode wherein said organic substance layer including at least the luminous layer is formed by a transfer method.

* * * * *